United States Patent [19]
Sassa et al.

[11] Patent Number: 5,650,641
[45] Date of Patent: Jul. 22, 1997

[54] SEMICONDUCTOR DEVICE HAVING GROUP III NITRIDE COMPOUND AND ENABLING CONTROL OF EMISSION COLOR, AND FLAT DISPLAY COMPRISING SUCH DEVICE

[75] Inventors: Michinari Sassa; Masayoshi Koike; Katsuhide Manabe; Norikatsu Koide; Hisaki Kato; Naoki Shibata; Makoto Asai; Shinya Asami, all of Aichi-ken, Japan

[73] Assignee: Toyoda Gosei Co., Ltd., Aichi, Japan

[21] Appl. No.: 522,110

[22] Filed: Aug. 31, 1995

[30] Foreign Application Priority Data

| Sep. 1, 1994 | [JP] | Japan | 6-234122 |
| Sep. 16, 1994 | [JP] | Japan | 6-248838 |
| Sep. 16, 1994 | [JP] | Japan | 6-248839 |
| Sep. 16, 1994 | [JP] | Japan | 6-248840 |
| Dec. 28, 1994 | [JP] | Japan | 6-338503 |

[51] Int. Cl.$^6$ .................. H01L 33/00
[52] U.S. Cl. .................. 257/88; 257/89; 257/90; 257/101; 257/102; 257/103
[58] Field of Search .................. 257/13, 88, 89, 257/90, 91, 101, 102, 103; 352/800

[56] References Cited

U.S. PATENT DOCUMENTS

| 5,274,251 | 12/1993 | Ota et al. | 257/103 |
| 5,406,093 | 4/1995 | Endo et al. | 257/102 |

FOREIGN PATENT DOCUMENTS

| 6-53549 | 2/1994 | Japan | 257/103 |

*Primary Examiner*—Minh-Loan Tran
*Attorney, Agent, or Firm*—Cushman Darby & Cushman IP Group of Pillsbury Madison & Sutro LLP

[57] ABSTRACT

A light-emitting semiconductor device (100) suitable for use in multi-color flat panel displays includes a sapphire substrate (1), an AlN buffer layer (2), a silicon (Si) doped GaN n$^+$-layer (3) of high carrier (n-type) concentration, a Si-doped $(Al_{x2}Ga_{1-x2})_{y2}In_{1-y2}N$ n$^+$-layer (4) of high carrier (n-type) concentration, a zinc (Zn) and Si-doped p-type $(Al_{x1}Ga_{1-x1})_{y1}In_{1-y1}N$ emission layer (5), and a Mg-doped $(Al_{x2}Ga_{1-x2})_{y2}In_{1-y2}N$ p-layer (6). The AlN layer (2) has a 500 Å thickness. The GaN n$^+$-layer (3) is about a 2.0 μm thick and has a $2\times10^{18}/cm^3$ electron concentration. The n$^+$-layer (4) is about a 2.0 μm in thickness and has a $2\times10^{18}/cm^3$ electron concentration. The emission layer (5) is about 0.5 μm thick. The p-layer 6 is about 1.0 μm thick and has a $2\times10^{17}/cm^3$ hole concentration. Nickel electrodes (7, 8) are connected to the p-layer (6) and n$^+$-layer (4), respectively. A groove (9) electrically insulates the electrodes (7, 8). Green light emission is obtained by this constitution. Further, only doping Zn of $5\times10^{19}/cm^3$ into the emission layer (5) enables red light emission.

28 Claims, 13 Drawing Sheets

SEMICONDUCTOR DEVICE HAVING GROUP III NITRIDE COMPOUND AND ENABLING CONTROL OF EMISSION COLOR, AND FLAT DISPLAY COMPRISING SUCH DEVICE

BACKGROUND OF THE INVENTION

1. Field of the Invention

The present invention relates to a light emitting semiconductor device that uses a Group III nitride compound. Specifically, the invention relates to a LED and to flat or panel-type display utilizing light-emitting semiconductor elements that are formed on a substrate and selectively enabled to emit light of a single color or one of the three primary colors at s time.

2. Description of the Related Art

It has been known that an aluminum gallium indium nitride (AlGaInN) compound semiconductor may be used to obtain a light-emitting diode (LED) which emits blue light). This semiconductor device is useful because of its high luminous efficiency resulting from direct electron transition and because of its ability to emit blue light, which is one of the three primary colors.

Irradiating an electron beam into and heat treatment of a magnesium (Mg) doped i-layer alters the layer to exhibit p-type conduction. As a result, s LED with a double hetero p-n junction structure made of an aluminum gallium nitride (AlGaN) p-layer, a zinc (Zn) doped indium gallium nitride (InGaN) emission layer, and an AlGaN n-layer becomes useful instead of a conventional LED of metal insulator semiconductor (MIS) structure that includes an n-layer and a semi-insulating i-layer.

The emission layer of the LED with a double hetero p-n junction structure is doped with only Zn as the luminous center and exhibits semi-insulative characteristics. Electrons are injected from the n-layer and holes from the p-layer into the emission layer. Light is emitted by the recombination of those injected electrons and holes when the diode is forward biased.

Several experiments were carried out altering the doping amount of the donor and the acceptor impurities into the emission layer and measuring the luminous colors emitted. As a result, the luminous colors were found by the inventors of the present invention to change depending on the amount of donor and acceptor impurities.

SUMMARY OF THE INVENTION

The present invention is, therefore, based on the above-described experiments. It is an object of the present invention to obtain a GaN group compound LED which can emit each color of the three primary colors. It is another object of the present invention to realize a full color flat display on a substrate by forming three picture elements as a unit (a triad) which can selectively emit each of the three primary colors.

According to the first aspect of the invention, there is provided a light-emitting semiconductor device constituted by:

an n-layer with n type conduction of Group III nitride compound semiconductor satisfying the formula $Al_xGa_yIn_{1-x-y}N$, inclusive of x=0, y=0, and x=y=0;

a p-layer with p type conduction of Group III nitride compound semiconductor satisfying the formula $Al_xGa_yIn_{1-x-y}N$, inclusive of x=0, y=0, and x=y=0;

an emission layer of Group III nitride compound semiconductor satisfying the formula $Al_xGa_yIn_{1-x-y}N$, inclusive of x=0, y=0, and x=y=0;

a double hetero-junction structure comprising the emission layer sandwiched between the n-layer and the p-layer, the n-layer and p-layer having wider band gaps than the emission layer; and wherein emission colors from the emission layer are controlled by altering the concentration of donor and/or acceptor impurity doped thereto.

Green light emission whose peak wave length is 490 to 560 nm is possible when the emission layer is doped with donor and acceptor impurities within the range of $5\times10^{18}/cm^3$ to $1\times10^{21}/cm^3$, respectively.

Yellow to red light emission whose peak wavelength is 560 to 700 nm is possible when the emission layer is doped with an acceptor impurity within the range of $5\times10^{18}/cm^3$ to $1\times10^{21}/cm^3$.

When the concentration of the donor and acceptor impurities are smaller than $5\times10^{18}/cm^3$ the emission color becomes not green or red but blue. When the impurity concentration is larger than $1\times10^{21}/cm^3$, crystallinity is degraded resulting in low luminous efficiency.

Further, electron irradiation or heat treatment may be used to obtain p-type conduction, when the emission layer exhibits semi-insulative characteristics. In that case, the treatment is preferably carried out after Mg is doped into the emission layer.

According to the second aspect of the invention, there is provided a flat display of three primary colors on a substrate suitable for use in or as a flat panel display. The flat display is constituted by:

a substrate;

emission regions each with a triple layer structure as a unit, being manufactured on the substrate;

the triple layer structure being made of an n-layer with n type conduction of Group III nitride compound semiconductor satisfying the formula $Al_xGa_yIn_{1-x-y}N$, inclusive of x=0, y=0, and x=y=0, a p-layer with p-type conduction of Group III nitride compound semiconductor satisfying the formula $Al_xGa_yIn_{1-x-y}N$, inclusive of x=0, y=0, and x=y=0, and an emission layer of Group III nitride compound semiconductor satisfying the formula $Al_xGa_yIn_{1-x-y}N$, inclusive of x=0, y=0 and x=y=0;

the triple-layer structure having a double hereto-junction structure comprising the emission layer sandwiched between the n-layer and the p-layer, the n-layer and p-layer each having wider band gaps than the emission layer; and wherein each emission color is one of three primary colors being controlled by altering the impurity concentration and/or composition ratio x and y of the emission layer of each of the emission regions.

Emission of the three primary colors may be obtained by altering the impurity concentration doped into the emission layer, by altering the composition ratio x and y of the emission layer, or by altering both.

When the impurity concentration of respective Si and Zn doped into the emission layer is smaller than $1\times10^{19}/cm^3$, blue light emission is realized When the concentration of respective Si and Zn is within the range of $1\times10^{19}/cm^3$ to $1\times10^{21}/cm^3$ 20, green light emission is realized. When only Zn of $1\times10^{19}/cm^3$ to $1\times10^{21}/cm^3$ impurity concentration is doped into the emission layer, red light emission is obtained.

Each of the emission regions may be organized as a first emission region on the substrate, a second emission region on the first emission region, and a third emission region on the second emission region. Additionally an electrode connected to a bottom layer of the triple-layer structure of each of the emission regions and an electrode connected to a top layer of the triple-layer structure of each of the emission regions are formed. A groove electrically separating each of the emission regions and a groove electrically separating the electrode for the n-layer from the electrode for the p-layer to prevent a short circuit are also formed.

As a further variant, the flat display may have a groove electrically separating each of the emission regions, an exposed portion exposing a region of the n-layer or the p-layer of each of the emission regions, and an electrode on the exposed portion of the n-layer or the p-layer.

As a further variant of the flat display, the top layer of the first emission region and the bottom layer of the second emission region may be shared in common with each other, and the top layer of the second emission region and the bottom layer of the third emission region may share each other in common.

According to the third aspect of the invention, there is provided a flat display having an emission plane having a picture element defined by three adjacent dots as a unit (i.e., a triad) emitting each one of the three primary colors and being arranged in two dimensions, and an emission layer of each of the three adjacent dots being doped with acceptor and donor impurities of different concentrations from each other by ion injection to emit respective ones of the three primary colors.

One of the three dots emits blue light being doped with Zn of $1\times10^{18}/cm^3$ to $1\times10^{19}/cm^3$ and Si of $1\times10^{18}/cm^3$ to $1\times10^{19}/cm^3$, one of the three dots emits green light being doped with Zn of $1\times10^{19}/cm^3$ to $1\times10^{21}/cm^3$ and Si of $1\times10^{19}/cm^3$ to $1\times10^{21}/cm^3$, and one of the three dots emits red light being doped with Zn of $1\times10^{19}/cm^3$ to $1\times10^{21}/cm^3$.

In the first to the third aspects of the invention, Si can be used as a donor impurity and Zn as an acceptor impurity. The emission layer with p-type conduction can be obtained by doping Mg and electron irradiation or heat treatment.

Other objects, features, and characteristics of the present invention will become apparent upon consideration of the following description in the appended claims with reference to the accompanying drawings, all of which form a part of the specification, and wherein referenced numerals designate corresponding parts in the various figures.

DETAILED DESCRIPTION OF THE PREFERRED EMBODIMENT

The invention will be more fully understood by reference to the following examples.

EXAMPLE 1

Figure 1:
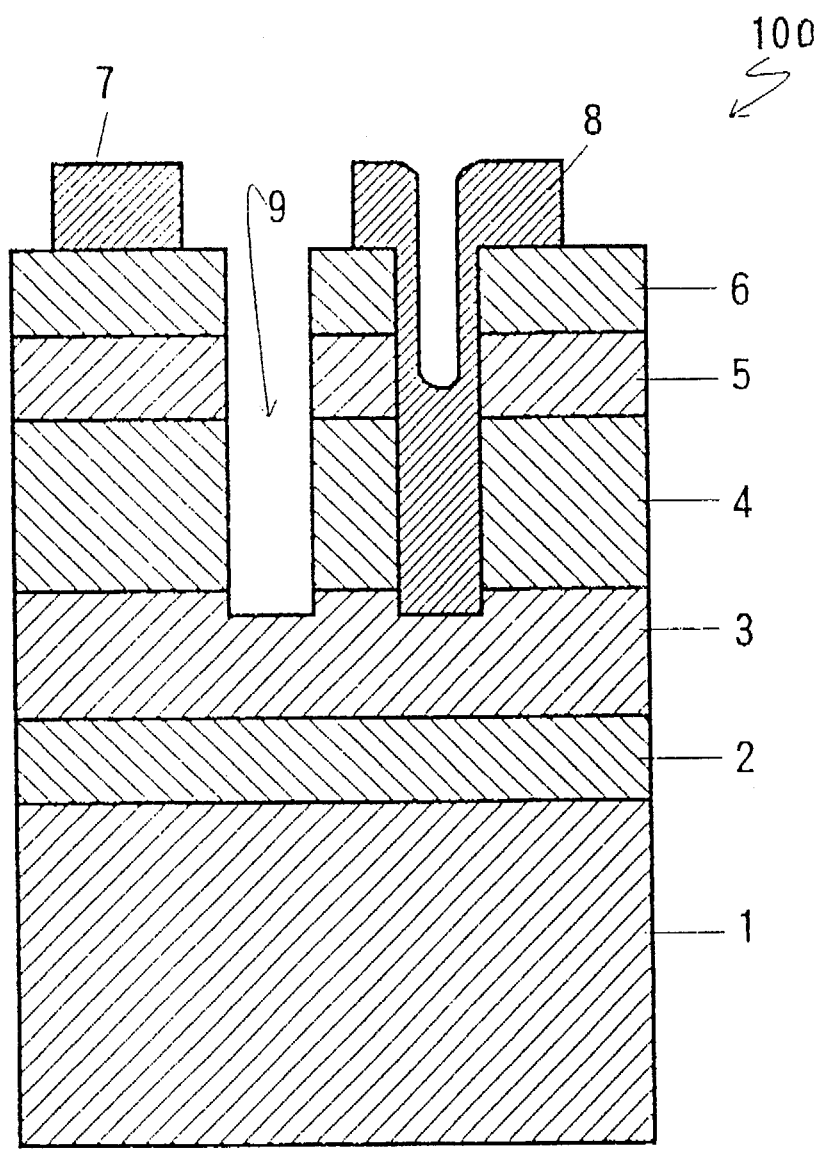
FIG. 1 is a sectional view showing the structure of the LED embodied in Example 1.

FIG. 1 shows a LED 100 embodied in Example 1. It has a sapphire ($Al_2O_3$) substrate 1 upon which the following five layers are consecutively formed: an AlN buffer layer 2; a silicon (Si) doped GaN $n^+$-layer 3 of high carrier (n-type) concentration; a Si-doped $(Al_{x2}Ga_{1-x2})_{y2}In_{1-y2}N$ $n^+$-layer 4 of high carrier (n-type) concentration; a zinc (Zn) and Si-doped $(Al_{x1}Ga_{1-x1})_{y1}In_{1-y1}N$ emission layer 5; and a Mg-doped $(Al_{x2}Ga_{1-x2})_{y2}In_{1-y2}N$ p-layer 6. The AlN layer 2 has a 500 Å thickness. The GaN $n^+$-layer 3 is about 2.0 μm in thickness and has a $2\times10^{18}/cm^3$ electron concentration. The $n^+$-layer 4 is about 2.0 μm in thickness and has a $2\times10^{18}/cm^3$ electron concentration. The emission layer 5 has about a 0.5 μm thickness. The p-layer 6 has about 1.0 μm thickness and has a $2\times10^{17}/cm^3$ hole concentration. Nickel electrodes 7 and 8 are connected to the p-layer 6 and the $n^+$-layer 4, respectively. They are electrically insulated from one another by a groove 9.

The LED 100 is produced by gaseous phase epitaxial growth, called metal organic vapor phase epitaxy referred to as MOVPE hereinafter. The gases employed in this process are ammonia ($NH_3$), a carrier gas ($H_2$ or $N_2$), trimethyl gallium ($Ga(CH_3)_3$) (TMA hereinafter), trimethyl aluminum ($Al(CH_3)_3$) (TMA hereinafter), trimethyl indium ($In(CH_3)_3$) (TMI hereinafter), silane ($SiH_4$), and diethylzine (($C_2H_5)_2Zn$) (DEZ hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure for a period of 5 min.

On the etched sapphire substrate 1, a 500 Å thick AlN buffer layer 2 was formed on the surface 'a' under conditions of lowering the temperature in the chamber to 400° C., keeping the temperature constant, and supplying $H_2$ at a flow rate of 20 liter/min., $NH_3$ at 10 liter/min., and TMA at $1.8\times10^{-5}$ mol/min. for a period of about 90 sec. On the buffer layer 2, about a 2.2 μm thick Si-doped GaN $n^+$-layer 3 of high carrier concentration with an electron concentration of about $2\times10^{18}/cm^3$ was formed under conditions of keeping the temperature of the sapphire substrate 1 at 1150° C. and supplying $H_2$ at a flow rate of 20 liter/min., $NH_3$ at 10 liter/min., TMG at $1.7\times10^{-4}$ mol/min., and diluted silane to 0.86 ppm by $H_2$ at $1\times10^{-8}$ mol/min. for 30 min., respectively. The following manufacturing process provides for an emission layer 5 as an active layer, an $n^+$-layer 4 of high carrier concentration and a p-layer 6 as clad layers; the LED 100 is designed to emit at a 520 nm wavelength peak in the luminous spectrum and has luminous centers of Zn and Si.

On the $n^+$-layer 3, about a 0.5 μm thick Si-doped $(Al_{0.47}Ga_{0.53})_{0.9}In_{0.1}N$ $n^+$-layer 4 of high carrier concentration with an electron concentration of $1\times10^{18}/cm^3$ was formed under conditions of keeping the temperature of the sapphire substrate 1 at 850° C. and supplying $N_2$ or $H_2$ at a flow rate of 10 liter/min., $NH_3$ at 10 liter/min., TMG at $1.12\times10^{-4}$ mol/min., TGA at $0.47\times10^{-4}$ mol/min., TMI at $0.1\times10^{-4}$ mol/min., and diluted silane to 0.86 ppm by $H_2$ at $1\times10^{-8}$ mol/min. for 60 min.

On the $n^+$-layer 4, about a 0.5 μm thick Zn- and Si-doped $(Al_{0.3}Ga_{0.7})_{0.94}In_{0.06}N$ emission layer 5 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMA at $0.47\times10^{-4}$ mol/min., TMI $0.02\times10^{-4}$ mol/min., DEZ at $6\times10^{-7}$ mol/min., and diluted silane to 0.86 ppm by $H_2$ at $1\times10^{-8}$ mol/min. for 60 min. The impurity concentrations of Zn and Si doped to the emission layer 5 were $4\times10^{19}/cm^3$, respectively.

On the emission layer 5, about a 1.0 μm thick Mg-doped $(Al_{0.47}Ga_{0.53})_{0.9}In_{0.1}N$ p-layer 6 was formed under conditions of keeping the temperature of the sapphire substrate 1 at 1100° C. and supplying $N_2$ or $H_2$ at a flow rate of 20 liter/min., $NH_3$ at 10 liter/min., TMG at $1.12\times10^{-4}$ mol/min., TMA at $0.47\times10^{-4}$ mol/min., TMA at $0.47\times10^{-4}$ mol/min., TMI at $0.1\times10^{-4}$ mol/min., and $CP_2Mg$ at $2\times10^{-4}$ mol/min. for 120 min. Resistivity of the p-layer 6 was $10^8$ Ω·cm or more exhibiting insulative characteristics. The impurity concentration of the Mg doped into the p-layer 6 was $1\times10^{20}/cm^3$.

Figure 2:
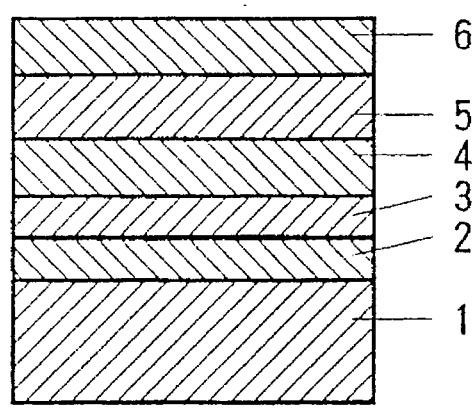
FIGS. 2 through 7 are sectional views illustrating successive steps of producing the LED embodied in Example 1.

Then, electron rays were uniformly irradiated into the p-layer 6 using s reflective electron beam diffraction device. The irradiation conditions were set at 10 KV for the accelerating voltage, 1 μA for the sample current, 0.2 mm/sec. for the speed of the beam scanning, 60 μmϕ for the beam aperture, and at $5.0\times10^{-5}$ Torr vacuum. This irradiation changed the insulative p-layer 6 into a p-type conductive semiconductor with a hole concentration of $2\times10^{17}/cm^3$ and a resistivity of 2 Ω·cm. Thereby, a wafer with multi-structural layers was obtained as shown in FIG. 2.

FIGS. 3 to 7 show sectional views of the formations of an individual device on the wafer. In actual practice and in accordance with industry custom, a wafer with a large number of elements thereon is treated by the following process and divided or diced into individual devices.

Figure 3:
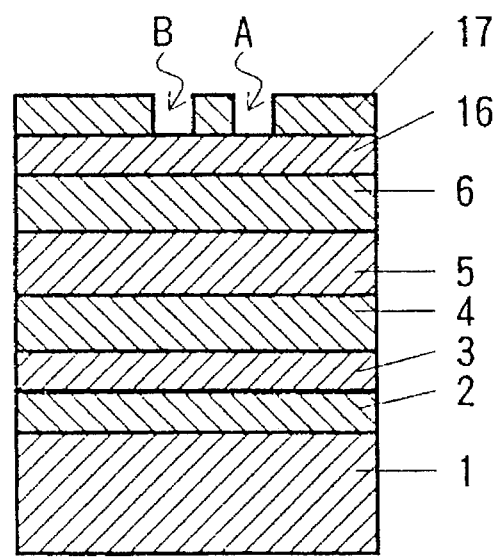
Figure 5:
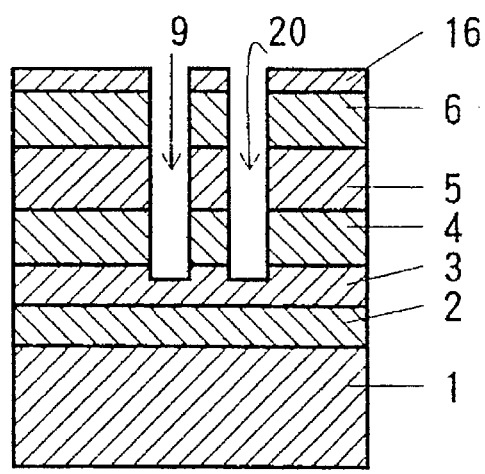

A 2000 Å thick $SiO_2$ layer 16 was formed on the p-layer 6 by sputtering. Then, the layer 16 was coated with a photoresist layer 17. Two selected parts or areas of the photoresist layer 17, named A and B, were removed by photolithography as shown in FIG. 3. The part or area A is an electrode-forming aperture which corresponds to a place where a hole 20, shown in FIG. 5, is formed extending to and into the $n^+$-layer 4 of high carrier concentration. The part or area B corresponds to a place where a trench like isolation groove 9, shown in FIGS. 5 and 6, is formed for insulating or electrically insulating the part or area A from an electrode in contact with the p-layer 6.

Figure 4:
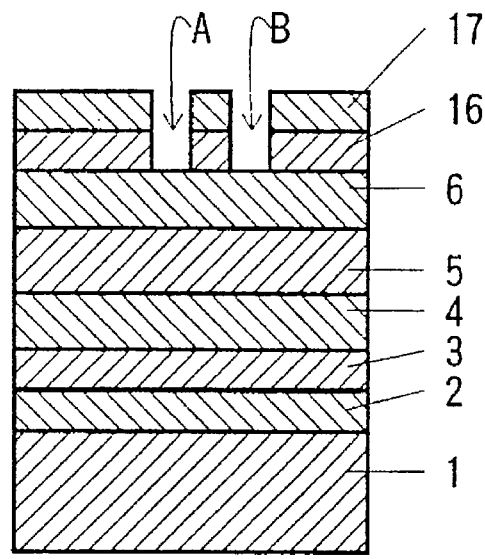

As shown in FIG. 4, two parts of the $SiO_2$ layer 16 which were not covered with the photoresist layer 17 were etched off by an etching liquid such as hydrofluoric acid. Then, the exposed part of the following successive three layers from the surface of the device, the p-layer 6, the emission layer 5, and the upper part of the $n^+$-layer 4 of high carrier concentration, were removed by dry etching, or supplying a high-frequency power density of 0.44 W/cm$^2$ and $BCl_3$ gas of 10 ml/min. at a vacuum degree of 0.04 Torr as shown in FIG. 5. After that, dry etching with argon (Ar) was carried out on the device. Consequently, a hole 20 for forming an electrode reaching the $n^+$-layer 4 of high carrier concentration and a trench-like groove 9 for insulation purposes are formed.

Figure 6:
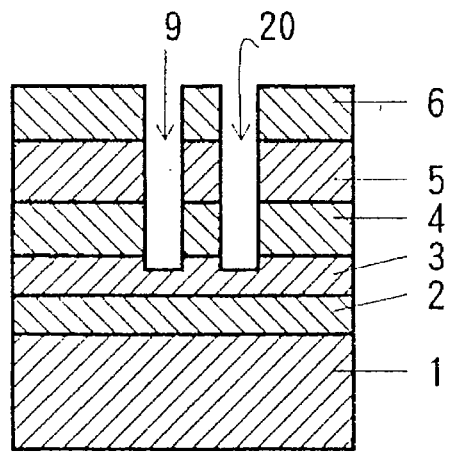
Figure 7:
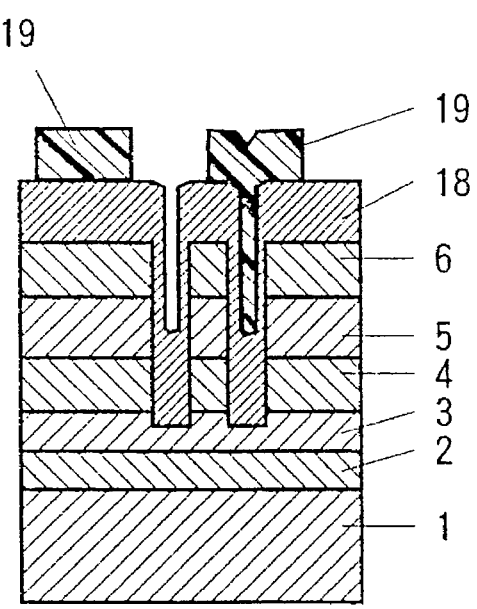

The $SiO_2$ layer 16 remaining on the p-layer 6 was removed by hydrofluoric acid as shown in FIG. 6. A nickel (Ni) layer 18 was laminated on the entire surface of the device by vapor deposition. Thus, the so-formed Ni layer 18 in the hole 20 is in electrical contact with the $n^+$-layer 4 of high carrier concentration. A photoresist 19 was deposited on the Ni layer 18. The photoresist 19 was then selectively etched off by photolithography leaving patterns of configuration (FIG.7) for the to-be-formed electrodes connected to the $n^+$-layer 4 of high carrier concentration and the p-layer 6, respectively.

Using the photoresist 19 as a mask, the exposed part or area of the Ni layer 18 from the photoresist 19 was etched off by an etching liquid such as nitric acid. At this time, the nickel layer 18 laminated in the groove 9 was also removed completely. Then, the photoresist layer 19 was removed by a photoresist removal liquid such as acetone. There were formed two electrodes, the electrode 8 for the $n^+$-layer 4 of high carrier concentration and the electrode 7 for the p-layer 6. The trench-like groove 9 insulates the electrodes 7 and 8 from one another. A wafer treated with the above-mentioned process was divided or diced into each chip or element which thus constituted a gallium nitride light-emitting diode with a p-n junction structure as shown in FIG. 1.

The obtained LED 100 was found to have a luminous intensity of 2 cd and a wavelength of 520 nm at a driving current of 20 mA.

The emission layer 5 preferably contains impurity concentrations of Zn and Si within a range of $5\times10^{18}/cm^3$ to $1\times10^{21}/cm^3$ respectively in order to improve luminous intensity.

In order to make the band gap of the emission layer 5 smaller than those of its respective adjacent two layers, i.e., the p-layer 6 and the $n^+$-layer 4 of high carrier concentration, a double hetero-junction structure was utilized for the LED 100 in this embodiment.

Further, it is preferable that the composition ratios of Al, Ga, and In in the respective three layers 4, 5, and 6 are selectively designed to meet with or match the lattice constant of GaN in the $n^+$-layer 3 of high carrier concentration as precisely as possible.

EXAMPLE 2

Figure 8:
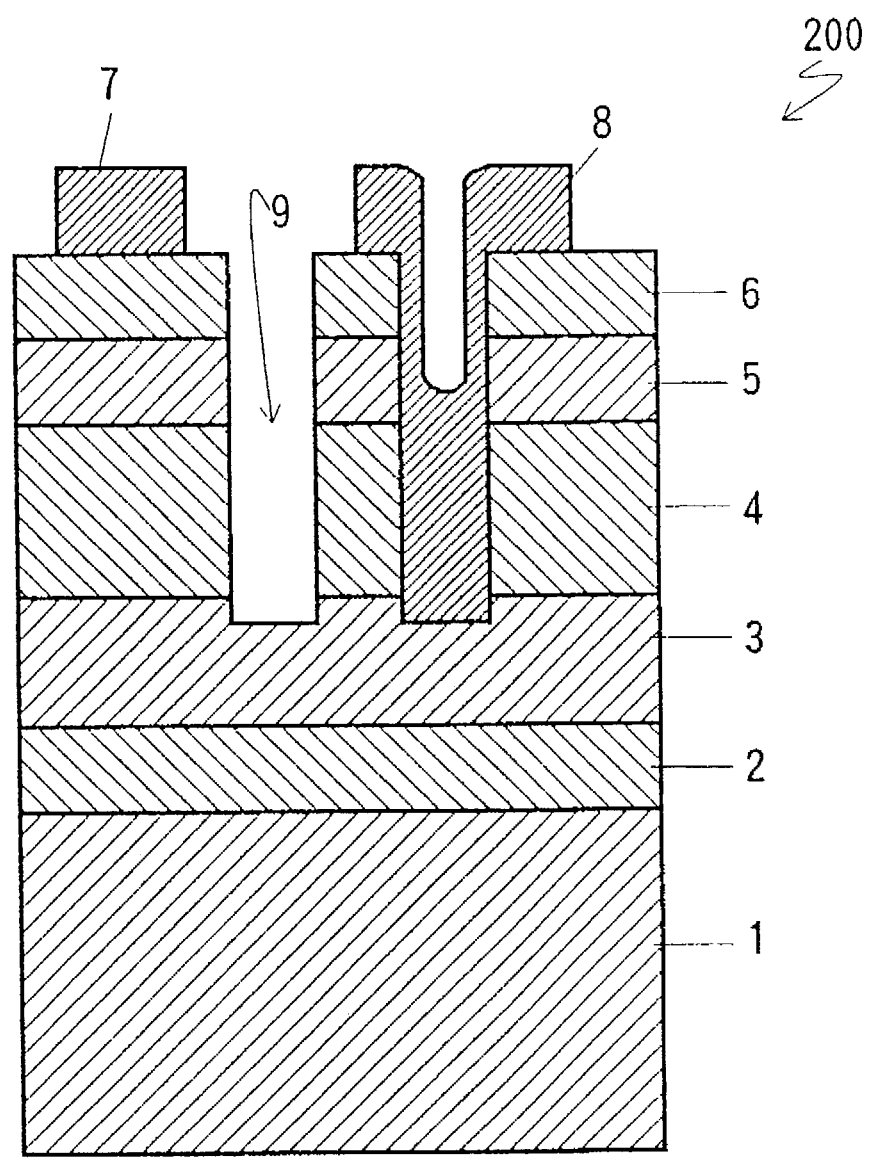
FIG. 8 is a sectional view showing the structure of the LED embodied in Example 2.

FIG. 8 shows a LED 200 in this embodiment. A difference between Examples 1 and 2 resides in which impurities are doped into the emission layer 5. Only Zn is doped into the emission layer 5 in Example 2.

Layers up to the $n^+$-layer 3 of high carrier concentration were formed by the same way as described in Example 1. On the $n^+$-layer 3, about a 0.5 μm thick Si-doped $(Al_{0.3}Ga_{0.7})_{0.94}In_{0.06}N$ $n^+$-layer 4 of high carrier concentration with an electron concentration of $2\times10^{18}/cm^3$ was formed under conditions of keeping the temperature of the sapphire substrate 1 at 800° C. and supplying $N_2$ at a flow rate of 20 liter/min., $NH_3$ at 10 liter/min., TMG at $1.12\times10^{-4}$ mol/min., TMA at $0.47\times10^{-4}$ mol/min., TMI at $0.1\times10^{-4}$ mol/min., and diluted silane to 0.86 ppm by $H_2$ at $1\times10^{-8}$ mol/min. for 60 min.

On the $n^+$-layer 4, about a 0.5 μm thick Zn-doped $(Al_{0.09}Ga_{0.91})_{0.99}In_{0.01}N$ emission layer 5 was formed under conditions of keeping the temperature of the sapphire substrate 1 at 1150° C. and supplying $N_2$ at a flow rate of 20 liter/min., $NH_3$ at 10 liter/min., TMG at $1.53\times10^{-4}$ mol/min., TMA at $0.47\times10^{-4}$ mol/min., TMI $0.02\times10^{-4}$ mol/min., DEZ at $5\times10^{-6}$ mol/min. for 7 min. The impurity concentration of Zn doped into the emission layer 5 was $5\times10^{19}/cm^3$ respectively On the emission layer 5, about a 1.0 μm thick Mg-doped $(Al_{0.3}Ga_{0.7})_{0.94}In_{0.06}N$ p-layer 6 was formed under conditions of keeping the temperature of the sapphire substrate 1 at 1100° C. and supplying $N_2$ at a flow rate of 20 liter/min., $NH_3$ at 10 liter/min., TMG at $1.12\times10^{-4}$ mol/min., TMA at $0.47\times10^{-4}$ mol/min., TMI at $0.1\times10^{-4}$ mol/min., and $CP_2Mg$ at $2\times10^{-4}$ mol/min. for 120 min. Resistivity of the p-layer 6 was $10^8$ Ω·cm or more exhibiting insulative characteristics. The impurity concentration of the Mg doped into the p layer 6 was $1\times10^{20}/cm^3$.

Then, electron rays were uniformly irradiated into the p-layer 6 under the as same conditions as that described in Example 1. This irradiation changed the insulative p-layer 6 into a p-type conductive semiconductor. Other manufacturing processes were the same as those of Example 1. The obtained LED 200 was found to have a luminous intensity of 2 cd and a wavelength of 640 nm at a driving current of 20 mA.

Only Zn was doped into the emission layer 5 to obtain red light emission. Alternatively, doping Mg and irradiating electrons into the emission layer 5 can be used.

EXAMPLE 3

Figure 9:
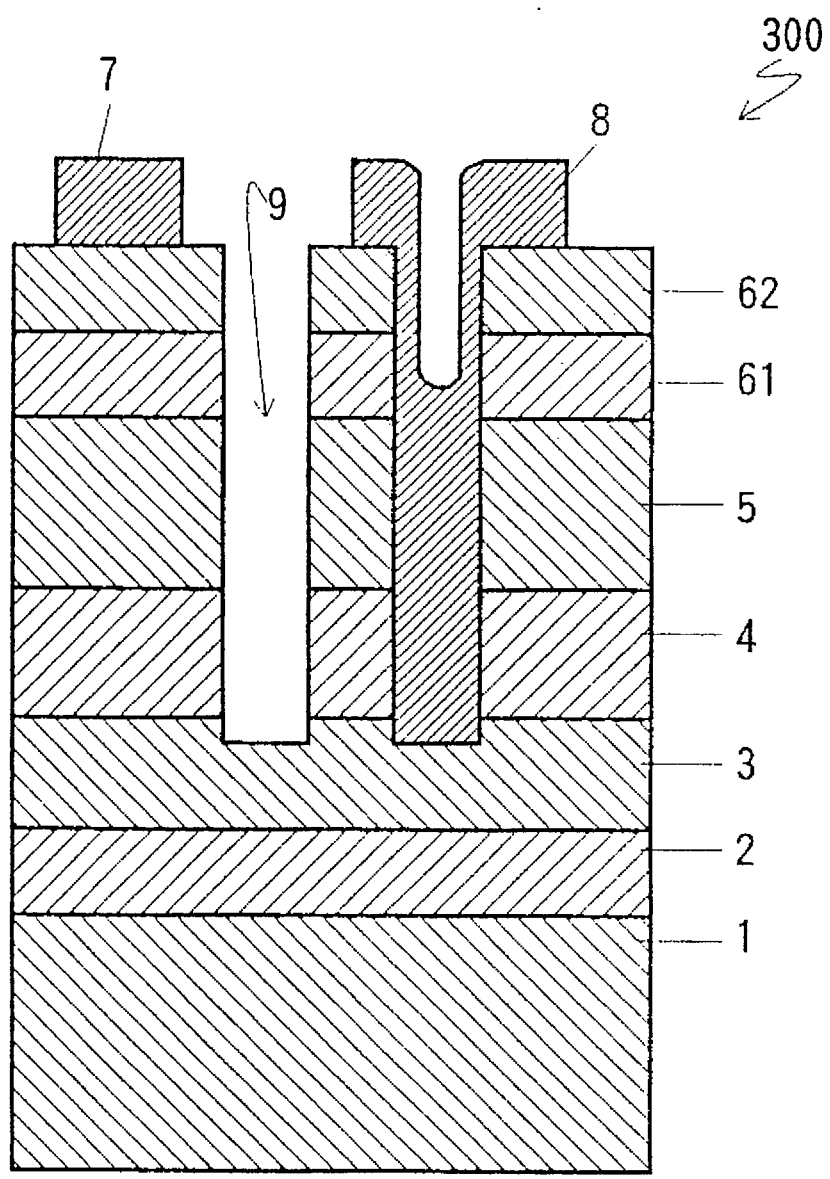
FIGS. 9 and 10 are sectional views showing the structure of the LED embodied in Example 3.

FIG. 9 shows a LED 300 in this embodiment. Differences from the LED 100 in Example 1 reside in the emission layer 5, a p-layer 61, and n$^+$-layer 4. In this Example 3, the emission layer 5 is constituted by Mg-, Zn-, and Si-doped $Ga_yIn_{1-y}N$, the p-layer 61 is constituted by Mg-doped $Al_{x1}Ga_{1-x1}N$, and the n$^+$-layer 4 of high carrier concentration is constituted by Si-doped $Al_{x2}Ga_{1-x2}N$. The composition ratios of x1, y, and x2 of the respective three layers 61, 4, and 5 are selectively designed to form a double hetero-junction structure making the band gap of the emission layer 5 smaller than those of its respective adjacent two layers, i.e., the p-layer 6 and the n$^+$-layer 4 of high carrier concentration.

Figure 10:
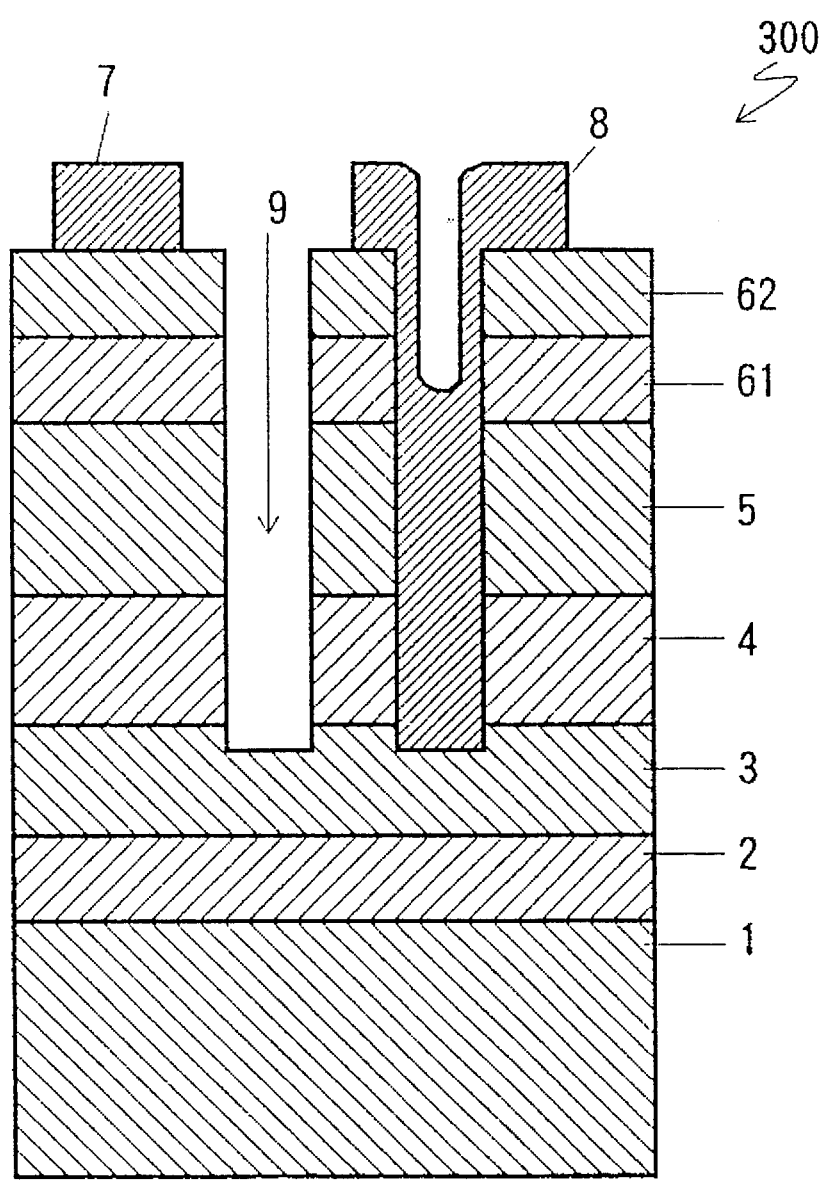

In FIG. 10, the LED 800 has a sapphire ($Al_2O_3$) substrate 1 upon which the following six layers are consecutively formed: an AlN buffer layer 2; a GaN n$^+$-layer 3; a Si-doped GaN n$^+$-layer 4 of high carrier (n-type) concentration; a Mg-, Zn-, and Si-doped $Ga_{0.94}In_{0.06}N$ emission layer 5; a Mg-doped $Al_{0.1}Ga_{0.9}N$ p-layer 61; and a Mg-doped GaN contact layer 62. The AlN layer 2 has a 500 Å thickness. The GaN n$^+$-layer 3 has about 2.0 μm thickness and has a $2\times10^{18}$/cm$^3$ electron concentration. The GaN n$^+$-layer 4 has about 4.0 μm thickness and has a $2\times10^{18}$/cm$^3$ electron concentration. The emission layer 5 has about 0.5 μm thickness. The p-layer 61 has about a 0.5 μm thickness and has a $2\times10^{17}$/cm$^3$ electron concentration. The contact layer 62 has about 0.5 μm thickness and has a $2\times10^{17}$/cm$^3$ hole concentration. Nickel electrodes 7 and 8 are connected to the contact layer 62 and the n$^+$-layer 4, respectively. They are electrically insulated from one another by a groove 9.

The layers up to the n$^+$-layer 3 were formed in the same way as that described in Example 1. Then, on the n$^+$-layer 3, about a 4.0 μm thick Si-doped GaN n$^+$-layer 4 of high carrier concentration with an electron concentration of about $2\times10^{18}$/cm$^3$ was formed.

The following manufacturing process provides for the emission layer 5 as active layer, the p-layer 61 as clad layer, and the contact layer 62; the LED 300 is designed to emit at a 520 nm wavelength peak in the luminous spectrum and has luminous centers of Zn and Si.

On the n$^+$-layer 4, about a 0.5 μm thick Mg-, Zn-, and Si-doped $Ga_{0.94}In_{0.06}N$ emission layer 5 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMI at $0.02\times10^{-4}$ mol/min., $CP_2Mg$ at $2\times10^{-4}$ mol/min., DEZ at $2\times10^{-7}$ mol/min., and diluted silane to 0.86 ppm by $H_2$ at $1\times10^{-8}$ mol/min. for 60 min. At this stage, the emission layer 5 exhibited insulative characteristics.

On the emission layer 5, about a 0.5 μm thick Mg-doped $Al_{0.1}Ga_{0.9}N$ p-layer 61 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., TMA at $0.47\times10^{-4}$ mol/min., and $CP_2Mg$ at $2\times10^{-7}$ mol/min. for 7 min. Resistivity of the p-layer 6 was $10^8$ Ω·cm or more exhibiting insulative characteristics. The impurity concentration of the Mg doped into the p-layer 61 was $1\times10^{19}$/cm$^3$.

On the p-layer 61, about a 0.5 μm thick Mg-doped GaN contact layer 62 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $2\times10^{-4}$ mol/min. for 7 min. Resistivity of the contact layer 62 was $10^8$ Ω·cm or more exhibiting insulative characteristics. The impurity concentration of the Mg doped into the p-layer 62 was $1\times10^{20}$/cm$^3$.

Then, electron rays were uniformly irradiated into the emission layer 5, the p-layer 61, and the contact layer 62 using a reflective electron beam diffraction device. The irradiation conditions were as same as those in Example 1. This irradiation changed the emission layer 5, the p-layer 61, and the contact layer 62 into p-type conductive semiconductors with a hole concentration of $2\times10^{17}$/cm$^3$ and a resistivity of 2 Ω·cm. Thereby, the LED 300 was obtained whose emission layer 5 was p-type and emitted green light.

In Examples 1 to 3, Mg and Zn were employed as acceptor impurities and Si as a donor impurity. Alternatively, beryllium (Be), cadmium (Cd), and mercury (Hg) can be used as an acceptor impurity. Alternatively, carbon (C), germanium (Ge), tin (Sn), lead (Pb), sulfur (S), selenium (Se), and tellurium (Te) can be used as a donor impurity.

In Examples 1 to 3, electron irradiation was used. Alternatively, heat annealing, heat treatment in the atmosphere of $N_2$ plasma gases, and laser irradiation can be used.

EXAMPLE 4

Figure 11:
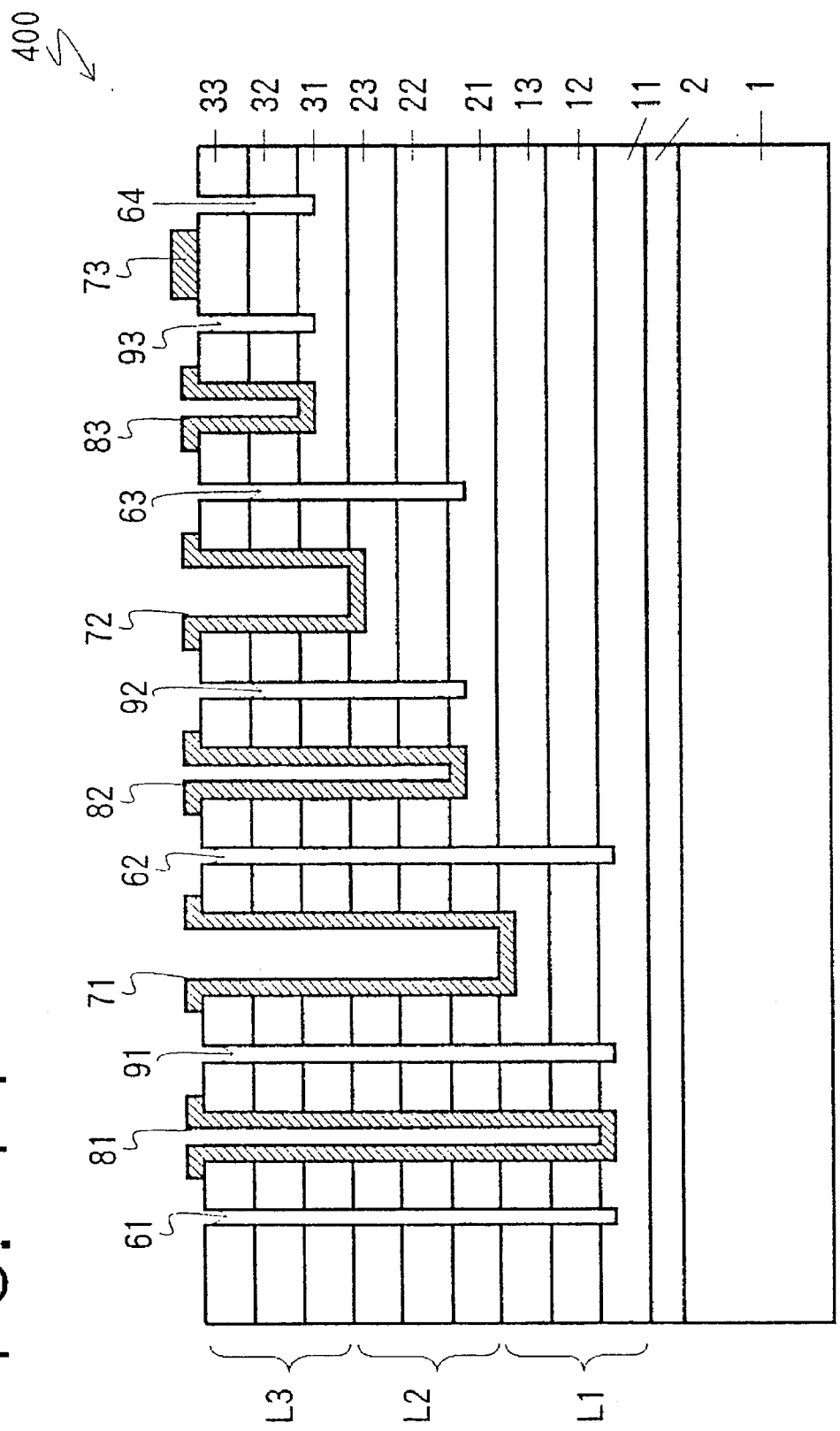
FIG. 11 is a sectional view showing the structure of the LED embodied in Example 4.

FIG. 11 shows a plane LED 400 embodied in Example 4. As explained in more detail below, the LED 400 shown in FIG. 11 is fabricated as a multi-layer structure including three emissions layers 12, 22, and 32, each emission layer being part of a three layer emission region L1, L2, and L3 and each emission layer designed to emit light at a different wavelength. The LED 400 is divided into three adjacent, electrically isolated surface areas with appropriately formed electrodes and isolation grooves so that driving current can be applied to the electrodes in an area associated with a respective one of the emission layers 12, 22, and 32 to emit light from the selected emission layer. The LED 400 has a sapphire ($Al_2O_3$) substrate 1 upon which a 500 Å thick AlN buffer layer 2 is formed. On the AlN layer 2, the first emission region L1 is formed which is consecutively organized as the following triple-layer structure: a Si-doped GaN n-layer 11; a Zn- and Si-doped $In_{0.08}Ga_{0.92}N$ emission layer 12, Mg-doped GaN p-layer 13. The n-layer 11 is about 2.0 μm in thickness and has a $2\times10^{18}$/cm$^3$ electron concentration. The emission layer 12 is about 0.5 μm in thickness and is doped with a $1\times10^{18}$/cm$^3$ impurity concentration of respective Zn and Si. The p-layer 13 has about a 1.0 μm thickness and has a $2\times10^{17}$/cm$^3$ hole concentration.

On the first emission region L1, the second emission region L2 is formed which is consecutively constituted by the following triple-layer structure: a Si-doped GaN n-layer 21; a Zn- and Si-doped $In_{0.08}Ga_{0.92}N$ emission layer 22, Mg-doped GaN p-layer 23. The n-layer 21 is about 2.0 μm in thickness and has a $2\times10^{18}$/cm$^3$ electron concentration. The emission layer 22 is about 0.5 μm in thickness and is doped with respective Zn and Si of $5\times10^{19}$/cm$^3$ impurity concentration. The p-layer 23 has about a 1.0 μm thickness and has a $2\times10^{17}$/cm$^3$ hole concentration.

On the second emission region L2, the third emission region L3 is formed which is consecutively constituted by the following three layers: a Si-doped GaN n-layer 31; a Zn-doped $In_{0.08}Ga_{0.92}N$ emission layer 32, Mg-doped GaN p-layer 33. The n-layer 31 is about 2.0 μm in thickness and has a $2\times10^{18}/cm^3$ electron concentration. The emission layer 32 is about 0.5 μm in thickness and is doped with Zn of $5\times10^{19}/cm^3$ impurity concentration. The p-layer 33 has about a 1.0 μm thickness and has a $2\times10^{17}/cm^3$ hole concentration.

Nickel electrodes 81 and 71 are connected to the n-layer 11 and the p-layer 13 of the first emission region L1, respectively. They are electrically insulated by a groove 91. Nickel electrodes 82 and 72 are connected to the n-layer 21 and the p-layer 23 of the second emission region L2, respectively. They are electrically insulated by a groove 92. Nickel electrodes 83 and 73 are connected to the n-layer 31 and the p-layer 33 of the third emission region L3, respectively. They are electrically insulated by a groove 93. The emission regions L1, L2, and L3 are electrically insulated or isolated by grooves 61, 62, 63, and 64. The grooves 61, 62, and 91 extend into the GaN n-layer 11. The grooves 63 and 92 extend into the GaN n-layer 21. The grooves 64 and 93 extend into the GaN n-layer 31.

A manufacturing method of the LED 400 is described hereinafter utilizing MOVPE. The gases employed in the process was as same as those employed in Example 1.

The sapphire substrate 1 whose main surface is "a" and the 500 Å AlN buffer layer were prepared by the same process as that described in Example 1. On the AlN buffer layer 2, about a 2.0 μm thick Si-doped GaN n-layer 11 with an electron concentration of about $2\times10^{18}/cm^3$ was formed under conditions of keeping the temperature of the sapphire substrate 1 at 1150° C. and supplying $N_2$ or $H_2$ at a flow rate of 10 liter/min., $NH_3$ at 10 liter/min., TMG at $1.12\times10^{-4}$ mol/min., and diluted silane to 0.86 ppm by $H_2$ at $1\times10^{-8}$ mol/min. for 30 minutes.

On the n-layer 11, about a 0.5 μm thick Zn- and Si-doped $In_{0.08}Ga_{0.92}N$ emission layer 12 was formed under conditions of keeping the temperature of the sapphire substrate 1 at 850 ° C. and supplying $N_2$ or $H_2$ at a flow rate of 20 liter/min., $NH_3$ at 10 liter/min., TMG at $1.53\times10^{-4}$ mol/min., TMI at $0.02\times10^{-4}$ mol/min., DEZ at $2\times10^{-7}$ mol/min., and diluted silane to 0.86 ppm by $H_2$ at $1\times10^{-8}$ mol/min. for 60 min. The impurity concentrations of Zn and Si doped into the emission layer 12 were $1\times10^{18}/cm^3$, respectively.

On the emission layer 12, about a 1.0 μm thick Mg-doped GaN p-layer 13 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $2\times10^{-4}$ mol/min. for 120 min. Resistivity of the p-layer 13 was $10^8$ Ω·cm or more exhibiting insulative characteristics. The impurity concentration of the Mg doped into the p-layer 13 was $1\times10^{20}/cm^3$.

On the p-layer 13, about a 2.0 μm thick Si-doped GaN n-layer 21 with an electron concentration of about $2\times10^{18}/cm^3$ was formed under conditions of keeping the temperature of the sapphire substrate 1 at 850° C. and supplying $N_2$ or $H_2$ at a flow rate of 10 liter/min., $NH_3$ at 10 liter/min., TMG at $1.12\times10^{-4}$ mol/min., and diluted silane to 0.86 ppm by $H_2$ at $1\times10^{-8}$ mol/min. for 30 minutes.

On the n-layer 21, about a 0.5 μm thick Zn- and Si-doped $In_{0.08}Ga_{0.92}N$ emission layer 22 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMI at $0.02\times10^{-4}$ mol/min., DEZ at $1\times10^{-5}$ mol/min., and diluted silane to 0.86 ppm by $H_2$ at $5\times10^{-7}$ mol/min. for 60 min. The impurity concentrations of Zn and Si doped into the emission layer 22 were $5\times10^{19}/cm^3$, respectively.

On the emission layer 22, about a 1.0 μm thick Mg-doped GaN p-layer 23 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $2\times10^{-4}$ mol/min. for 15 min. Resistivity of the p-layer 23 was $10^8$ Ω·cm or more exhibiting insulative characteristics. The impurity concentration of the Mg doped into the p-layer 23 was $1\times10^{20}/cm^3$.

On the p-layer 23, about a 2.0 μm thick Si-doped GaN n-layer 81 with an electron concentration of about $2\times10^{18}/cm^3$ was formed under conditions of keeping the temperature of the sapphire substrate 1 at 850° C. and supplying $N_2$ or $H_2$ at a flow rate of 10 liter/min., $NH_3$ at 10 liter/min., TMG at $1.12\times10^{-4}$ mol/min., and diluted silane to 0.86 ppm by $H_2$ at $1\times10^{-8}$ mol/min. for 30 minutes.

On the n-layer 81, about a 0.5 μm thick Zn-doped $In_{0.08}Ga_{0.92}N$ emission layer 32 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMI at $0.02\times10^{-4}$ mol/min., and DEZ at $1\times10^{-5}$ mol/min. for 60 min. The impurity concentrations of Zn doped into the emission layer 32 was $5\times10^{19}/cm^3$.

On the emission layer 32, about a 1.0 μm thick Mg-doped GaN p-layer 33 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $2\times10^{-4}$ mol/min. for 15 min. Resistivity of the p-layer 33 was $10^8$ Ω·cm or more exhibiting insulative characteristics. The impurity concentration of the Mg doped into the p-layer 33 was $1\times10^{20}/cm^3$.

Then, heat treatment at the temperature of 900° C. was carried out for 5 min. to the sapphire substrate 1 changing the insulative p-layers 13, 23, and 33 into a p-type conductive semiconductors with a hole concentration of $2\times10^{17}/cm^3$ and a resistivity of 2 Ω·cm, respectively.

A $SiO_2$ film and, then, a photoresist layer were formed on the p-layer 83. Selected parts or areas of the photoresist layer where trench-like grooves 61 to 64 and 91 to 93 and electrodes 81 to 83 and 71 to 73 would be formed, were removed by photolithography. Utilizing the $SiO_2$ layer as a mask, holes for the trench-like grooves and the electrodes were formed by photolithography and dry etching. The holes which had the same depth were processed at the same time in a step by step manner leaving patterns of configuration for the to-be-formed electrodes and grooves. The electrodes 81 to 83 and 71 to 73 were formed by uniformly laminating a nickel layer on the entire device and etching off the nickel layer after a patterned mask was formed by photolithography. As a result, the LED 400 as shown in FIG. 11 was obtained.

Thereby obtained plane LED 400 was found to emit blue light in the first emission region L1, green in second L2, red in third L3 when higher voltage was applied to the electrodes 71 to 73 than to those of 81 to 83. FIG. 11 just shows a individual element on a layer substrate. In actual practice and in accordance with industry custom, a substrate with a large number of the elements thereon is treated by the above-described process at a time enabling a full-color planar display suitable for use in flat-panel displays (FPD).

EXAMPLE 5

Figure 12:
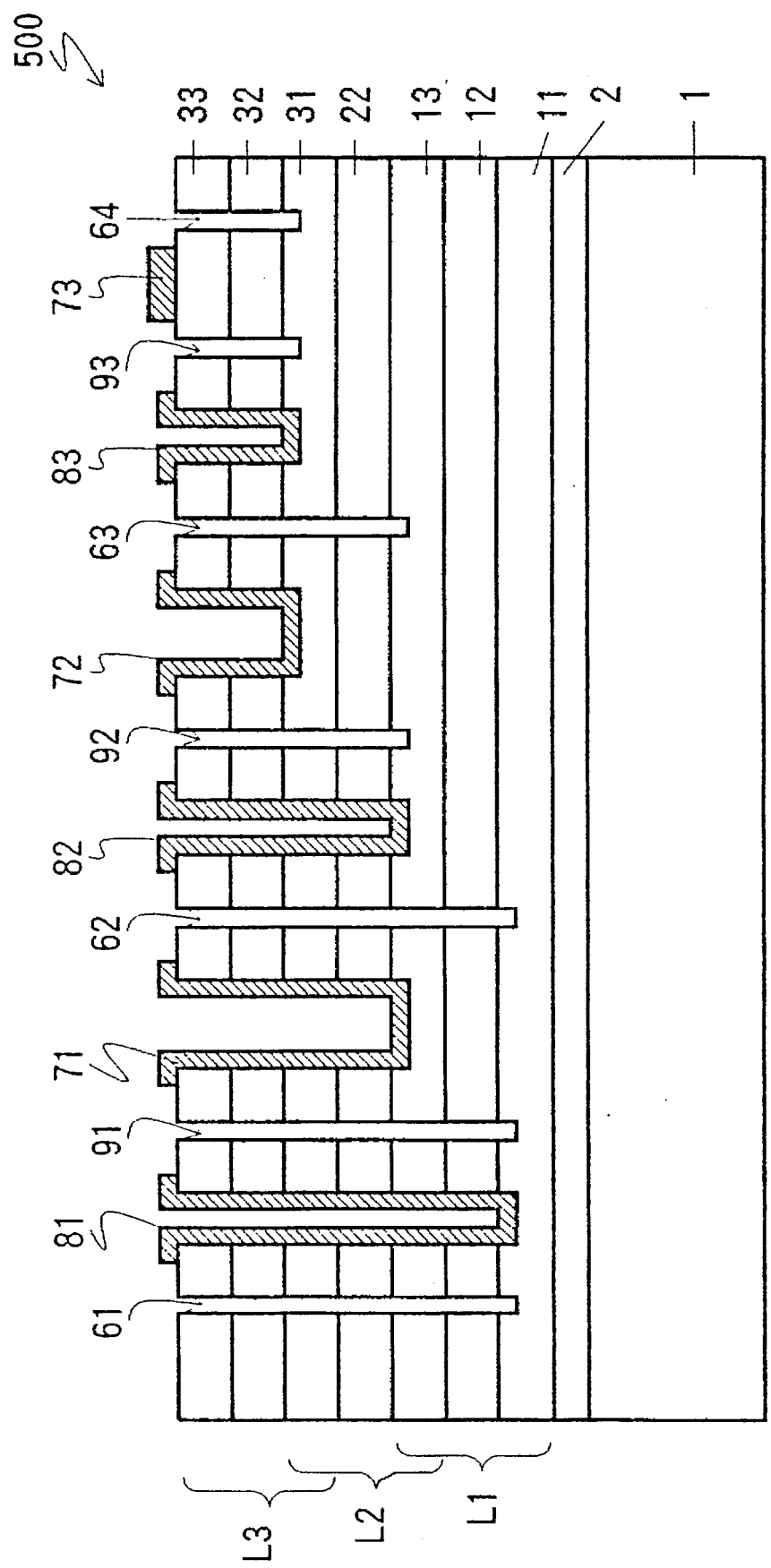
FIG. 12 is a sectional view showing the structure of the LED embodied in Example 5.

FIG. 12 shows a planar LED 500. The first and third emission regions L1 and L3 of the LED 500 are constituted identically as those of the LED 400 in Example 4. The second emission region L2 in Example 5 is formed by the p-layer 13 in the first emission region L1, an emission layer 22, and the n-layer 31 of the third emission region L3. Namely, the first and second emission regions L1 and L2 share in common the p-layer 13, and the second and third emission regions L2 and L3 share in common the n-layer 31. In other words, the order of the layers in the second emission region L2 from the side of the substrate, p-layer, emission layer, and n-layer, is the opposite to those of the first and third emission regions L1 and L3.

Trench-like grooves 61 to 64 have enough depth to separate the first to third emission regions L1 to L3 from each other. Trench-like grooves 91 to 93 have enough depth to separate electrodes 81 from 71, 82 from 72, and 83 from 73, respectively.

In Examples 4 and 5, the emission layers 12, 22, and 32 were doped with Zn and Si or Zn. Alternatively, they can be doped with Mg and heat treatment can be carried out thereto to obtain p-type conduction.

Figure 13:
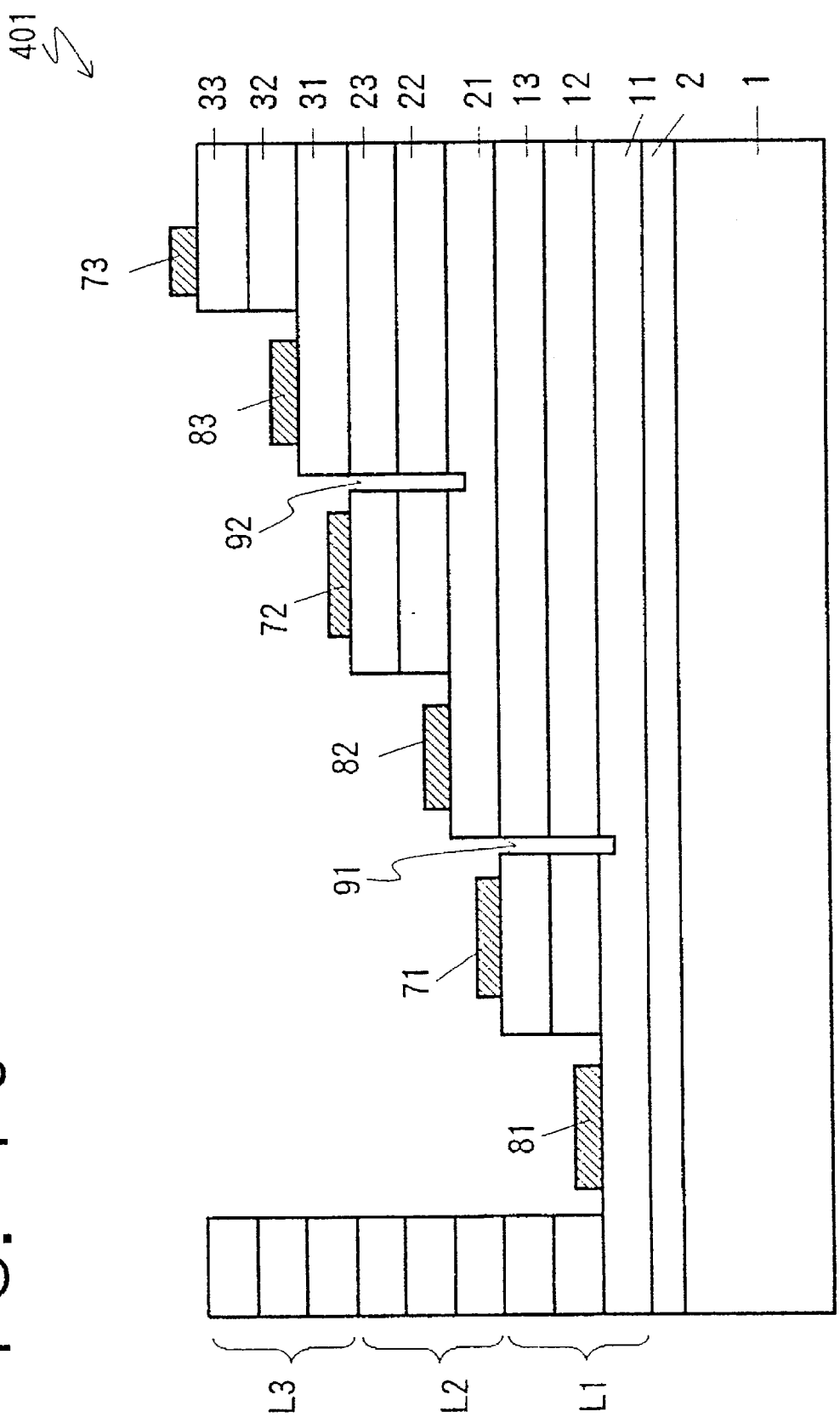
FIGS. 13 and 14 are sectional views of variations of FIGS. 11 and 12, respectively.

FIG. 13 shows a LED 401 as a variation of the LED 400 (FIG. 11) in Example 4. Etching was carried out step by step to expose the surface of the n-layer 11, the p-layer 13, the n-layer 21, the p-layer 23, and the n-layer layer 31 where electrodes 81, 71, 82, 72, and 83 were formed, respectively. Trench-like grooves 91 and 92 were formed to have enough depth to separate elements electrically from each other preventing short circuit occurring because of p-n junction structures.

Figure 14:
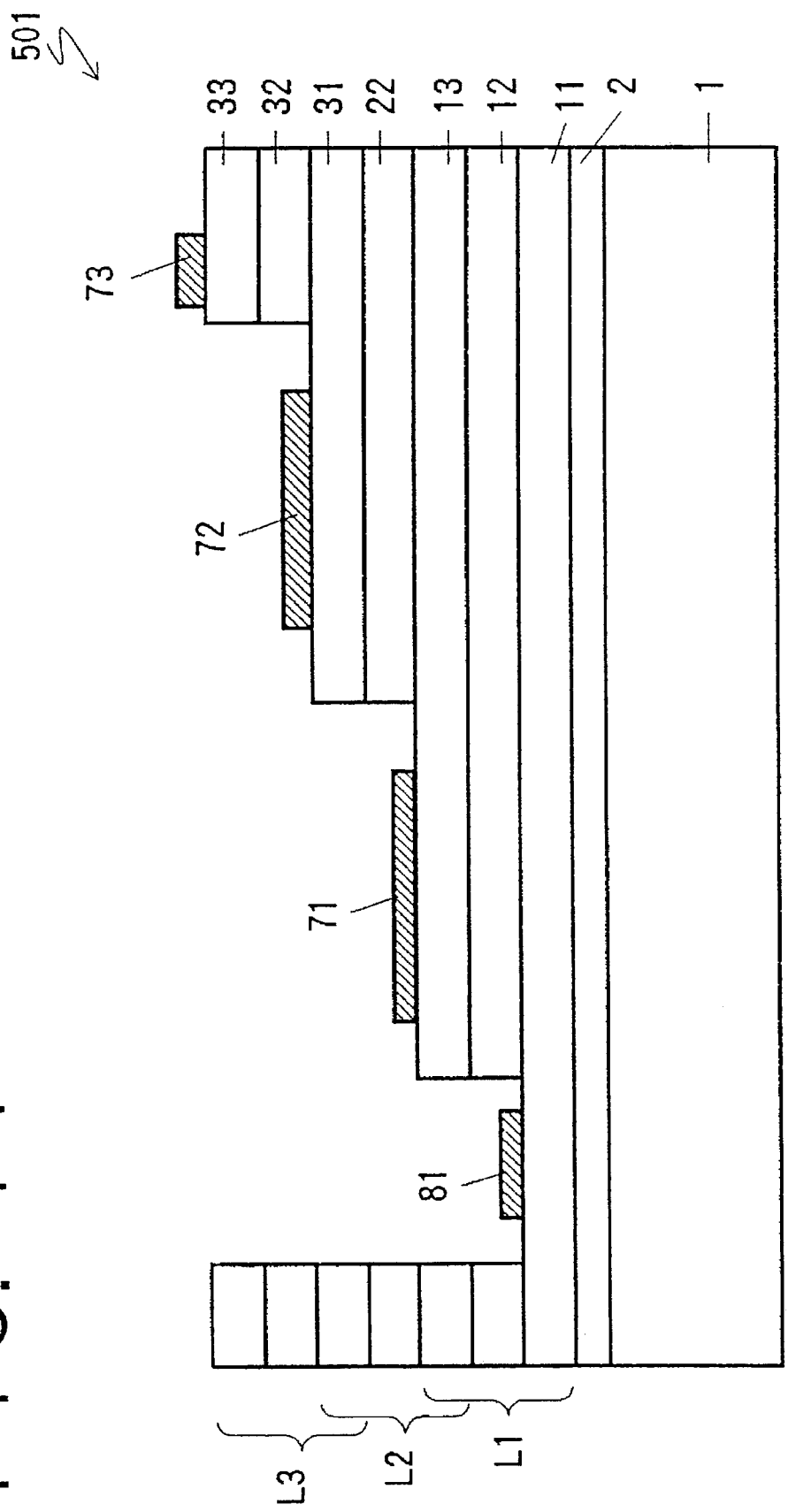

FIG. 14 show a LED 501 as a variation of the LED 500 (FIG. 12) in Example 5. When each layer is exposed by etching, electrodes 81, 71, 72, and 73 can be formed on the exposed portion of the n-layer 11, the p-layer 13, the n-layer 31, and the p-layer 33, respectively. The electrodes 81 and 71 are for the first emission region L1. The electrodes 71 and 72 are for the second emission region L2. The electrodes 72 and 73 are for the third emission region L3. Namely, the electrodes 71 and 72 are commonly owned by the emission regions L1 and L2 and L2 and L3, respectively.

In Examples 4 and 5, preferable impurity concentration doped into the emission layers differs in range among the first to third emission regions L1 to L3. The first emission region L1 which emits blue light preferably contains Si and Zn of $1\times10^{19}/cm^3$ or lesser impurity concentration, respectively. The second emission region L2 which emits green light preferably contains impurity concentration of Si and Zn within a range of $1\times10^{19}/cm^3$ to $1\times10^{21}/cm^3$, respectively. The third emission region L3 which emits red light preferably contains impurity concentration of Zn within a range of $1\times10^{19}/cm^3$ to $1\times10^{21}/cm^3$.

In Examples 4 and 5, emission colors were controlled by altering concentrations of acceptor and donor impurities doped into the emission layers in each of the emission regions L1 to L3. Alternatively, the colors can be controlled by forming the emission layer by the material $In_xGa_{1-x}N$ and altering its composition ratio x as 0.08, 0.15, and 0.30 in the first to third emission regions L1 to L3, respectively. As a further variant, the colors can be controlled by forming all layers by the material $Al_xGa_yIn_{1-x-y}N$, where x=0, y=0, and x=y=0 and altering their composition ratio to narrow differences between a band gap of the emission layer and those of the adjacent two layers, the n-layer and the p-layer.

EXAMPLE 6

Figure 15:
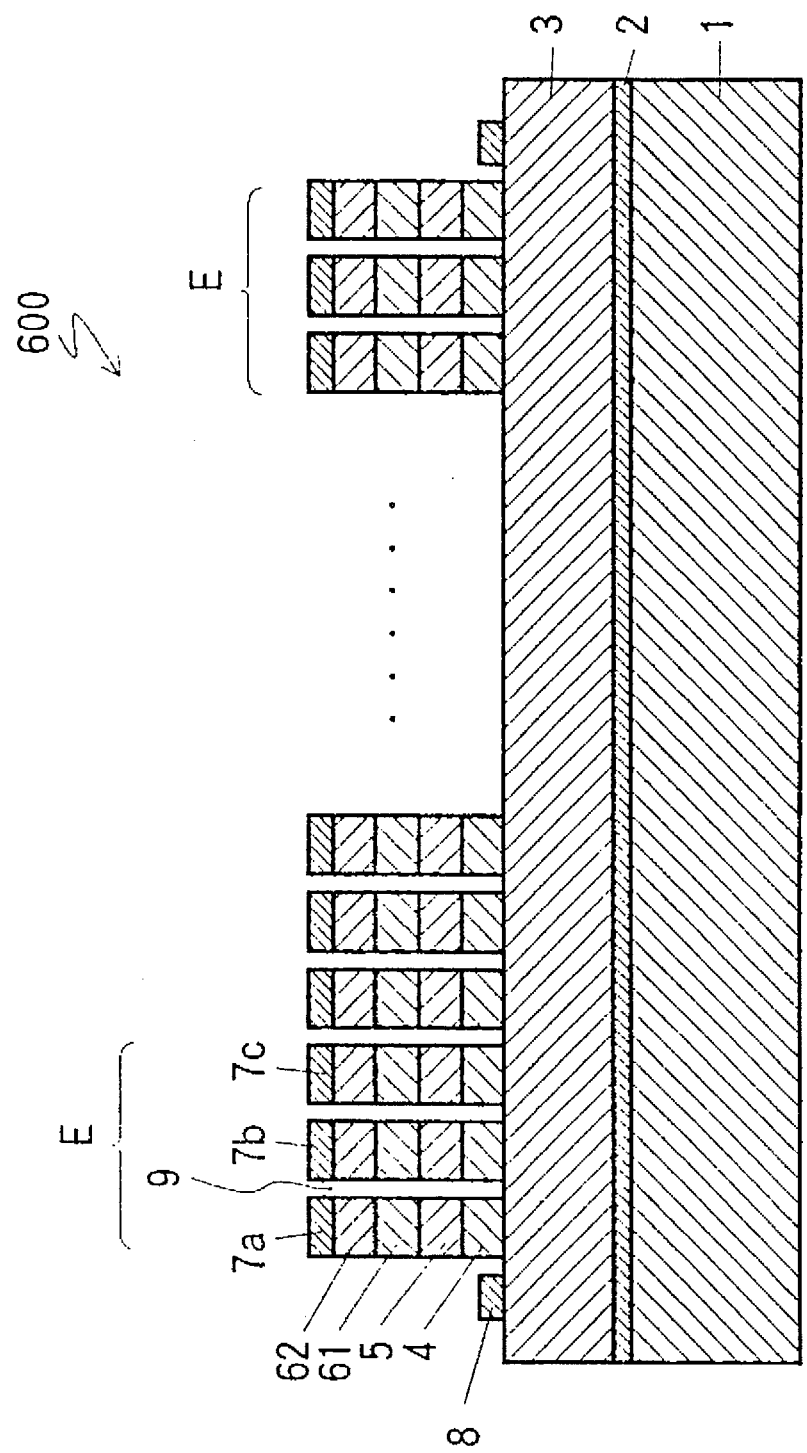
FIG. 15 is a sectional view showing the structure of the LED embodied in Example 6.
Figure 16:
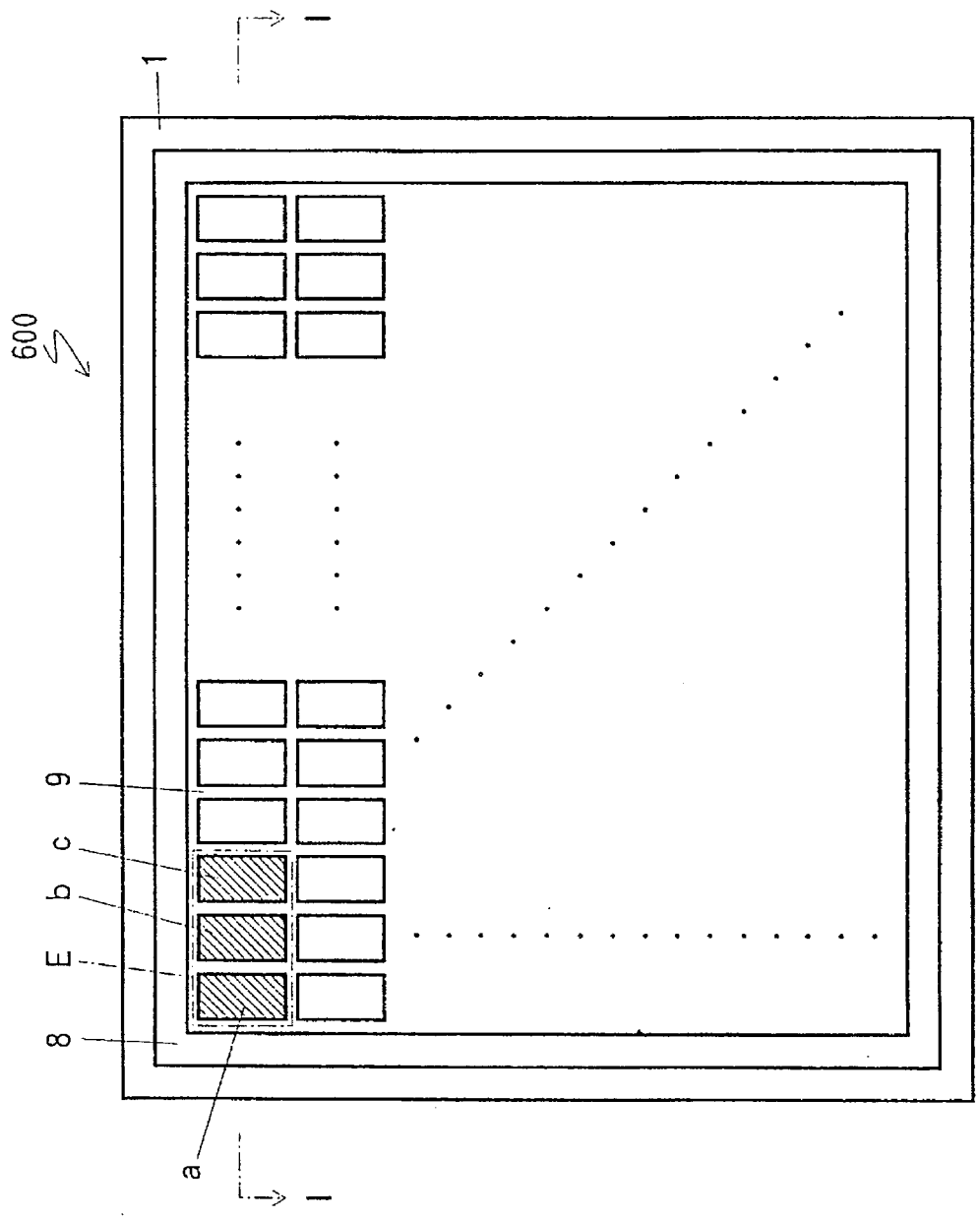
FIG. 16 is a top plain view of FIG. 15.

FIG. 15 shows a planar LED 600 in Example 6. It has a sapphire ($Al_2O_3$) substrate 1 upon which the following six layers are consecutively formed: an AlN buffer layer 2; a Si-doped GaN $n^+$-layer 3 of high carrier concentration; a Si-doped $Al_{0.1}Ga_{0.9}N$ $n^+$-layer 4 of high carrier (n-type) concentration; an $Ga_{0.94}In_{0.06}N$ emission layer 5; a Mg-doped $Al_{0.1}Ga_{0.9}N$ p-layer 61; and a Mg-doped GaN contact layer 62. The AlN layer 2 has s 500 Å thickness. The GaN $n^+$-layer 3 has about 2.0 µm thickness and has a $2\times10^{18}/cm^3$ electron concentration. The $Al_{0.1}Ga_{0.9}N$ $n^+$-layer 4 has about 0.5 µm thickness and has a $2\times10^{18}/cm^3$ electron concentration. The emission layer 5 has about 0.5 µm thickness. The p-layer 61 has about a 0.5 µm thickness and has a $2\times10^{17}/cm^3$ hole concentration. The contact layer 62 has about 0.5 µm thickness and has a $2\times10^{17}/cm^3$ hole concentration. Nickel electrodes 7a, 7b, 7c are connected to the contact layer 62. A nickel electrode 8 is connected to the $n^+$-layer 4. As shown in FIG. 16, the electrode 8 is formed surrounding a rectangular array of picture elements or pixels on the sapphire substrate 1 and functions as a common electrode for each dot of each of the picture elements or pixels. A groove 9 in a matrix pattern electrically insulates the electrodes for each dot 7a, 7b, and 7c, the contact layer 62, the p-layer 61, the emission layer 5, and the $n^+$-layer 4 of high carrier concentration from each other.

As shown in FIG. 16, a picture element E is constituted by the three dots of the electrodes 7a to 7c as a unit or triad. The picture element E is arranged in two dimensions on the substrate.

A manufacturing method of the LED 600 is described hereinafter utilizing MOVPE. The gases employed in the process was as same as those described in Example 1.

The sapphire substrate 1 whose main surface is "a", the 500 A AlN buffer layer, and the 2.0 µm thick Si-doped $n^+$-layer 3 of high carrier concentration were prepared by the same process as that described in Example 1.

On the $n^+$-layer 3, about a 0.5 µm thick Si-doped $Al_{0.1}Ga_{0.9}N$ $n^+$-layer 4 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., TMA at $0.47\times10^{-4}$ mol/min., and diluted silane to 0.86 ppm by $H_2$ at $1\times10^{-8}$ mol/min. for 7 min. The electron concentration of Si doped into the $n^+$-layer 4 was $2\times10^{18}/cm^3$.

On the $n^+$-layer 4, about a 0.5 µm thick Mg-doped $Ga_{0.94}In_{0.06}N$ emission layer 5 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMI at $0.02\times10^{-4}$ mol/min. and $CP_2Mg$ at $2\times10^{-7}$ mol/min. for 60 min.

On the emission layer 5, about a 0.5 µm thick Mg-doped $Al_{0.1}Ga_{0.9}N$ p-layer 61 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., TMA at $0.47\times10^{-4}$ mol/min. and $CP_2Mg$ at $2\times10^{-4}$ mol/min. for 7 min. Resistivity of the p-layer 61 was $10^8$ Ω·cm or more exhibiting insulative characteristics. The impurity concentration of the Mg doped into the p-layer 61 was $1\times10^{19}/cm^3$ On the p-layer 61, about a 0.5 µm thick Mg-doped GaN contact layer 62 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $2\times10^{-4}$ mol/min. for 7 min. Resistivity of the contact layer 62 was $10^8$ Ω·cm or more exhibiting insulative characteristics. The impurity concentration of the Mg doped into the contact layer 62 was $1\times10^{20}/cm^3$.

Then, ionized impurities were injected into the emission layers 5 of each dot of all picture elements or pixels shown in FIGS. 15 and 16. Ionized Si and Zn of $1\times10^{19}/cm^3$ each were selectively injected into the emission layer 5 of a dot a of each picture element E. Ionized Si and Zn of $5\times10^{20}/cm^3$ each were selectively injected into the emission layer 5 of a dot b of each picture element E. Ionized Zn of $5\times10^{20}/cm^3$ was selectively injected into the emission layer 5 of a dot c of each element E.

Heat treatment at 900° C. for 5 min. changed each of the insulative p-layer 61, contact layer 62, and emission layer 5 to have p-type conduction with a hole concentration of $2\times10^{17}/cm^3$ and a resistivity of 2 Ω·cm.

After a SiO$_2$ film and a photoresist film were formed, selected parts or areas of the photoresist layer were removed by photolithography utilizing the SiO$_2$ layer as a mask. Then, holes for the trench-like groove 9 in a matrix pattern and the electrode 8 were formed by photolithography and dry etching. A nickel layer was uniformly laminated on the entire device. After a patterned mask was formed by the photolithography, etching was carried out. Thereby obtained electrodes of three dots, 7a, 7b, and 7c per picture element E and the common electrode 8 as shown in FIGS. 15 and 16.

The obtained plane LED 600 was found to emit blue light from the dot a, green from dot b, red from dot c when higher voltage was applied to the electrodes 7a, 7b, and 7c than to the electrode 8. Thereby, the full-color flat panel or planar display LED 600 is obtained.

In Example 6, the preferable impurity concentration doped into the emission layers differs in range among the dots a to c. The dot a, which emits blue light, preferably contains impurity concentration of Si and Zn within the range of $1\times10^{18}/cm^3$ to $1\times10^{19}/cm^3$, respectively. When the concentration of Si and Zn is smaller than $1\times10^{18}/cm^3$ luminous intensity will be degraded. When the concentration of Si and Zn is larger than $1\times10^{19}/cm^3$ the emission color will be green or red. The dot b which emits green light preferably contains impurity concentration of Si and Zn within the range of $1\times10^{19}/cm^3$ to $1\times10^{21}/cm^3$ respectively When the concentration of Si and Zn is smaller than $1\times10^{19}/cm^3$ the emission color will be blue When the concentration of Si and Zn is larger than $1\times10^{21}/cm^3$, crystallinity will be degraded resulting in lower luminous intensity. The dot c which emits red light preferably contains impurity concentration of Zn within the range of $1\times10^{19}/cm^3$ to $1\times10^{21}/cm^3$ When the concentration of Zn is smaller than $1\times10^{19}/cm^3$ the emission color will be blue. When the concentration of Zn is larger than $1\times10^{21}/cm^3$ crystallinity will be degraded resulting in lower luminous intensity.

As a variant, the colors can be controlled by forming all layers by the material Al$_x$Ga$_y$In$_{1-x-y}$N, where x=0, y=0, and x=y=0 and altering their composition ratio to narrow a band gap of the emission layer than those of the adjacent two layers, the n layer and the p-layer. As a further variant, the n$^+$-layer 4 of high carrier concentration can be made of (Al$_{0.47}$Ga$_{0.53}$)$_{0.9}$In$_{0.1}$N, the emission layer 5 can be (Al$_{0.3}$Ga$_{0.7}$)$_{0.94}$In$_{0.06}$N, and the p-layer 61 can be (Al$_{0.47}$Ga$_{0.53}$)$_{0.9}$In$_{0.1}$N.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-emitting semiconductor device comprising:
    an n-layer with n-type conduction of Group III nitride compound semiconductor satisfying the formula Al$_x$Ga$_y$In$_{1-x-y}$N, inclusive of x=0, y=0 and x=y=0;
    a p-layer with p-type conduction of Group III nitride compound semiconductor satisfying the formula Al$_x$Ga$_y$In$_{1-x-y}$N, inclusive of x=0, y=0 and x=y=0;
    an emission layer of Group III nitride compound semiconductor satisfying the formula Al$_x$Ga$_y$In$_{1-x-y}$N, inclusive of x=0, y=0 and x=y=0;
    a double hetero-junction structure sandwiching said emission layer between said n-layer and said p-layer, said n-layer and said p-layer each having wide band gaps than said emission layer; and
    wherein emission color from said emission layer is controlled by altering at least one of a concentration of a donor impurity and a concentration of an acceptor impurity doped into said emission layer.

2. A light-emitting device of claim 1, wherein said emission layer emits light in the green region of the color spectrum, and is doped with donor and acceptor impurities, each within the range of $5\times10^{18}/cm^3$ to $1\times10^{21}/cm^3$.

3. A light-emitting device of claim 1, wherein said emission layer emits light in the yellow to red region of the color spectrum, and is doped with an acceptor impurity within the range of $5\times10^{18}/cm^3$ to $1\times10^{21}/cm^3$.

4. A light-emitting device of claim 1, wherein said donor impurity is silicon (Si) and said acceptor impurity is zinc (Zn).

5. A light emitting device of claim 1, wherein said emission layer is processed to have p-type conduction.

6. A light-emitting device of claim 5, wherein said emission layer is changed to have p-type conduction by doping magnesium (Mg) and by treating said emission layer with at least one of electron irradiation and heat treatment.

7. A light-emitting semiconductor according to claim 1, wherein said device comprises plural emission layers, each one of said plural emission layers emitting light of a different color as a result of control of at least one of a concentration of donor impurity and a concentration of an acceptor impurity doped into the respective emission layer.

8. A flat display comprising:
    a substrate;
    emission regions formed on said substrate, each said emission region comprising a unitary triple-layer structure;
    said triple-layer structure being made of an n-layer with n-type conduction of Group III nitride compound semiconductor satisfying the formula Al$_x$Ga$_y$In$_{1-x-y}$N, inclusive of x=0, y=0 and x=y=0, a p-layer with p-type conduction of Group III nitride compound semiconductor satisfying the formula Al$_x$Ga$_y$In$_{1-x-y}$N, inclusive of x=0, y=0 and x=y=0, and an emission layer of Group III nitride compound semiconductor satisfying the formula Al$_x$Ga$_y$In$_{1-x-y}$N, inclusive of x=0, y=0 and x=y=0;
    said triple-layer structure having a double hetero-junction structure sandwiching said emission layer between said n-layer and said p-layer, said n-layer and said p-layer each having wider band gaps than said emission layer; and
    wherein each emission color from said emission regions is one of three primary colors being controlled by altering concentrations of at least one of donor and acceptor impurities doped into said emission layer of each of said emission regions.

9. A flat display of claim 8, wherein each emission color is further controlled by altering a composition ratio x and y of said emission layer of each of said emission regions.

10. A flat display of claim 9, said emission regions comprising:
a first emission region on said substrate;
a second emission region on said first emission region;
a third emission region on said second emission region;
each of said emission regions comprising said triple-layer structure;
a pair of electrodes for each of said emission regions, each said pair comprising a first electrode connected to a bottom layer of said triple-layer structure and a second electrode connected to a top layer of said triple-layer structure;
grooves for electrically separating adjacent pairs of said emission regions; and
grooves reaching a bottom layer of each of said triple-layer structures for electrically separating and preventing a short circuit between said first electrode and said second electrode.

11. A flat display of claim 9, said emission regions comprising:
said emission regions collectively forming a step shape;
a first emission region formed on said substrate;
a second emission region formed on said first emission region exposing some part of said first emission region;
a third emission region formed on said second emission region exposing some part of said second emission region;
grooves electrically separating adjacent pairs of said emission regions; and
electrodes being formed on exposed parts of each of said emission regions.

12. A flat display of claim 8, wherein said donor impurity is silicon (Si) and said acceptor impurity is zinc (Zn).

13. A light-emitting device of claim 8, wherein said emission layer is processed to have p-type conduction.

14. A flat display of claim 8, each of said emission regions comprising:
a first emission region formed on said substrate;
a second emission region formed on said second emission region;
a third emission region formed on said second emission region;
a pair of electrodes for each of said emission regions, each said pair comprising a first electrode connected to a bottom layer of said triple-layer structure and a second electrode connected to a top layer of said triple-layer structure;
grooves for electrically separating adjacent pairs of said emission regions; and
grooves each reaching a bottom layer of each of said triple-layer structures for electrically separating and preventing a short circuit between said first electrode and second electrode.

15. A flat display of claim 14, wherein said top layer of said first emission region and said bottom layer of said second emission region share a common layer comprising one of said n-layer and said p-layer and said top layer of said second emission region and said bottom layer of said third emission region share a common layer comprising one of said n-layer and said p-layer.

16. A flat display of claim 14, said donor impurity is silicon (Si) and said acceptor impurity is zinc (Zn).

17. A flat display of claim 8, said emission regions comprising:
said emission regions collectively forming a step shape;
a first emission region formed on said substrate;
a second emission region formed on said first emission region exposing some part of said first emission region;
a third emission region formed on said second emission region exposing some part of said second emission region;
grooves electrically separating adjacent pairs of said emission regions;
electrodes being formed on said exposed portion of each of said emission regions.

18. A flat display of claim 17, wherein said top layer of said first emission region and said bottom layer of said second emission region are shared in common and said top layer of said second emission region and said bottom layer of said third emission region are shared in common.

19. A flat display according to claim 8, wherein a first subset of said emission layers emits light of a first primary color as a result of control of at least one of a concentration of donor impurity and a concentration of an acceptor impurity doped into each emission layer of said first subset, and a second subset of said emission layers emits light of a second different primary color as a result of control of at least one of a concentration of donor impurity and a concentration of an acceptor impurity doped into each emission layer of said second subset.

20. A flat display comprising:
a substrate;
emission regions each being formed on said substrate as a unitary triple-layer structure;
said triple-layer structure being made of an n-layer with n-type conduction of Group III nitride compound semiconductor satisfying the formula $Al_xGa_yIn_{1-x-y}N$, inclusive of x=0, y=0 and x=y=0, a p-layer with p-type conduction of Group III nitride compound semiconductor satisfying the formula $Al_xGa_yIn_{1-x-y}N$, inclusive of x=0, y=0 and x=y=0, and an emission layer of Group III nitride compound semiconductor satisfying the formula $Al_xGa_yIn_{1-x-y}N$, inclusive of x=0, y=0 and x=y=0;
said triple-layer structure having a double hetero junction structure sandwiching said emission layer by said n-layer and said p-layer, said n-layer and said p-layer each having wider band gaps than said emission layer;
wherein emission color from each of said emission regions is one of the three primary colors being controlled by altering composition ratio x and y of said emission layer of each of said emission regions and said emission regions further comprise:
a first emission region formed on said substrate;
a second emission region formed on said first emission region;
a third emission region formed on said second emission region;
a pair of electrodes for each of said emission regions, each said pair comprising a first electrode connected to a bottom layer of said triple-layer structure and a second electrode connected to a top layer of said triple-layer structure;
grooves for electrically separating adjacent pairs of said emission regions; and
grooves reaching a bottom layer of each of said triple-layer structures for electrically separating and preventing a short circuit between said first electrode and said second electrode.

21. A flat display of claim 20, wherein said top layer of first emission region and said bottom layer of said second emission region share one of said n-layer and said p-layer in common and said top layer of said second emission region and said bottom layer of said third emission region share one of said n-layer and said p-layer in common.

22. A flat display comprising:

a substrate;

emission regions each being formed on said substrate as a unitary triple-layer structure;

said triple-layer structure being made of an n-layer with n-type conduction of Group III nitride compound semiconductor satisfying the formula $Al_xGa_yIn_{1-x-y}N$ inclusive of $x=0$, $y=0$ and $x=y=0$, a p-layer with p-type conduction of Group III nitride compound semiconductor satisfying the formula $Al_xGa_yIn_{1-x-y}N$, inclusive of $x=0$, $y=0$ and $x=y=0$, and an emission layer of Group III nitride compound semiconductor satisfying the formula $Al_xGa_yIn_{1-x-y}N$, inclusive of $x=0$, $y=0$ and $x=y=0$;

said triple-layer structure having a double hetero-junction structure sandwiching said emission layer between said n-layer and said p-layer, said n-layer and said p-layer each having wider band gaps than said emission layer;

wherein an emission color emitted from each of said emission regions is one of three primary colors being controlled by altering a composition ratio x and y of said emission layer of each of said emission regions;

said emission regions collectively forming a step shape and further comprising:

a first emission region formed on said substrate;

a second emission region exposing said first emission region exposing some part of said first emission region;

a third emission region formed on said second emission region exposing some part of said second emission region;

grooves electrically separating adjacent pairs of said emission regions;

electrodes being formed on exposed parts of each of said emission regions.

23. A flat display of claim 22, wherein said top layer of said first emission region and said bottom layer of said second emission region are shared in common and said top layer of said second emission region and said bottom layer of said third emission region are shared in common.

24. A flat display having multi-layer structure made of a Group III nitride compound semiconductor satisfying the formula $Al_xGa_yIn_{1-x-y}N$, inclusive of $x=0$, $y=0$ and $x=y=0$, said multi-layer structure being on a substrate and comprising:

an emission plane having a picture element having adjacent three adjacent dots as a unit emitting each one of three primary colors, and being arranged in two dimensions; and emission layers of respective ones of said adjacent three dots being doped with at least one of acceptor and donor impurities of concentrations different from each other, the doping having been performed by ion injection.

25. A flat display of claim 24, wherein said emission layer is sandwiched between an n-layer formed on said substrate and a p-layer formed on another side of said emission layer, said n-layer and said p-layer each having wider band gaps than that of said emission layer.

26. A flat display of claim 24, wherein said donor impurity is silicon (Si) and said acceptor impurity is zinc (Zn).

27. A flat display of claim 24, wherein said emission layer has p-type conduction.

28. A flat display of claim 24, wherein one of said three dots emitting blue light is doped with Zn of $1\times10^{18}/cm^3$ to $1\times10^{19}/cm^3$ and Si of $1\times10^{18}/cm^3$ to $1\times10^{19}/cm^3$, one of said three dots emitting green light is doped with Zn of $1\times10^{19}/cm^3$ to $10^{21}/cm^3$ and Si of $1\times10^{19}/cm^3$ to $1\times10^{21}/cm^3$, and one of said three dots emitting red light is doped with Zn of $1\times10^{19}/cm^3$ to $1\times10^{21}/cm^3$.

* * * * *